(12) United States Patent
Park et al.

(10) Patent No.: US 9,070,981 B2
(45) Date of Patent: Jun. 30, 2015

(54) MULTI-LAYERED ELECTROMAGNETIC WAVE ABSORBER AND MANUFACTURING METHOD THEREOF

(75) Inventors: Ki Yeon Park, Hwaseong-si (KR); Seong Ho Yoon, Yongin-si (KR); Eun Seok Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 700 days.

(21) Appl. No.: 13/314,446

(22) Filed: Dec. 8, 2011

(65) Prior Publication Data
US 2012/0188114 A1    Jul. 26, 2012

(30) Foreign Application Priority Data

Jan. 25, 2011  (KR) .................. 10-2011-0007095

(51) Int. Cl.
*H01Q 17/00*   (2006.01)
*B32B 38/08*   (2006.01)
*H05K 9/00*    (2006.01)

(52) U.S. Cl.
CPC ............. *H01Q 17/00* (2013.01); *B32B 38/08* (2013.01); *B32B 2305/076* (2013.01); *B32B 2307/204* (2013.01); *B32B 2307/208* (2013.01); *B32B 2315/085* (2013.01); *B32B 2363/00* (2013.01); *B32B 2457/00* (2013.01); *H05K 9/0088* (2013.01)

(58) Field of Classification Search
CPC ... H01Q 17/00; H01Q 17/004; H05K 9/0088; B32B 38/08; B32B 2307/204; B32B 2307/208; B32B 2363/00; B32B 2315/085; B32B 2305/076; B32B 2457/00

USPC .......................................... 342/1–4
See application file for complete search history.

(56) References Cited

U.S. PATENT DOCUMENTS

| | | | | |
|---|---|---|---|---|
| 4,038,660 | A | * | 7/1977 | Connolly et al. ............. 342/1 |
| 5,381,149 | A | * | 1/1995 | Dougherty et al. .......... 342/1 |
| 5,576,710 | A | * | 11/1996 | Broderick et al. ............ 342/1 |
| 6,919,387 | B2 | * | 7/2005 | Fujieda et al. ............ 523/137 |
| 7,218,266 | B2 | * | 5/2007 | Fujieda et al. ............... 342/1 |
| 2005/0140539 | A1 | * | 6/2005 | Fujieda et al. ............... 342/1 |
| 2012/0188114 | A1 | * | 7/2012 | Park et al. .................... 342/1 |

FOREIGN PATENT DOCUMENTS

KR   20120085955 A  *  8/2012

OTHER PUBLICATIONS

Greco, S.; Sarto, M.S., "EM modeling and design of electrically thin laminated absorbers," Electromagnetic Compatibility, 2006. EMC 2006. 2006 IEEE International Symposium on , vol. 3, No., pp. 680,685, Aug. 14-18, 2006.*

(Continued)

*Primary Examiner* — John B Sotomayor
(74) *Attorney, Agent, or Firm* — Jefferson IP Law, LLP

(57) ABSTRACT

A multi layer electromagnetic wave absorber is provided. The absorber includes a surface layer comprising at least one of a dielectric lossy mixture and a magnetic lossy mixture, an absorption layer, laminated on a rear side of the surface layer, comprising: a dielectric lossy mixture having a higher loss than the dielectric lossy mixture for the surface layer, and a magnetic lossy mixture having a higher loss than the magnetic lossy mixture for the surface layer, and a boundary layer, laminated on a rear side of the absorption layer, comprising a conductive material.

11 Claims, 21 Drawing Sheets

(56) References Cited

OTHER PUBLICATIONS

Huan-Ke Chin; Hsiao-Chang Chu; Chun Hsiung Chen, "Propagation modeling of periodic laminated composite structures," Electromagnetic Compatibility, IEEE Transactions on , vol. 40, No. 3, pp. 218,224, Aug. 1998.*

Gona, S.; Kresalek, V., "Accuracy of multilayer equivalent models for composite laminated materials," Electromagnetics in Advanced Applications, 2009. ICEAA '09. International Conference on , vol., No., pp. 694,697, Sep. 14-18, 2009.*

Kyung-Yong Kim; Wang-Sup Kim; Sung-Youg Hong, "A study on the behavior of laminated electromagnetic wave absorber," Magnetics, IEEE Transactions on , vol. 29, No. 4, pp. 2134,2138, Jul. 1993.*

Jin Bong Kim; Jun Hyung Byun, "Influence of the CNT length on complex permittivity of composite laminates and on radar absorber design in X-band," Nanotechnology (IEEE—Nano), 2010 10th IEEE Conference on , vol., No., pp. 635,638, Aug. 17-20, 2010.*

Jia-Hui Fu; Qun Wu; Shao-Qing Zhang; Kuang Zhang; Fan-Yi Meng, "Design of multi-layers absorbers for low frequency applications," Electromagnetic Compatibility (APEMC), 2010 Asia-Pacific Symposium on , vol., No., pp. 1660,1663, Apr. 12-16, 2010.*

* cited by examiner

MULTI-LAYERED ELECTROMAGNETIC WAVE ABSORBER AND MANUFACTURING METHOD THEREOF

PRIORITY

This application claims the benefit under 35 U.S.C. §119(a) of a Korean patent application filed on Jan. 25, 2011 in the Korean Intellectual Property Office and assigned Serial No. 10-2011-0007095, the entire disclosure of which is hereby incorporated by reference.

BACKGROUND OF THE INVENTION

1. Field of the Invention

The present invention relates to a multi-layer electromagnetic wave absorber and a manufacturing method thereof. More particularly, the present invention relates to a multi-layer electromagnetic wave absorber with a thin thickness for improving an absorption performance in broadband communications and a manufacturing method thereof.

2. Description of the Related Art

Recently, as digital technology and the semiconductor industry have been rapidly developed, miniaturized and light-weight electrical devices for high speed and broadband services are being developed. However, electrical devices are sensitive to minute electromagnetic wave disturbances such that they can easily cause a malfunction in operation of the electrical devices.

As a countermeasure against such electromagnetic wave disturbances, an electromagnetic wave shielding technique for reflecting and shielding the electromagnetic wave with metal may be implemented. Also, an electromagnetic wave absorbing technique for absorbing the electromagnetic wave by an electromagnetic wave absorber may be implemented. However, recently, the electromagnetic wave absorbing technique has been widely used, because the electromagnetic wave shielding technique induces additional damage due to the shielded electromagnetic wave.

FIG. 1 is a cross-sectional view of a single layer electromagnetic wave absorber according to the related art.

Referring to FIG. 1, the single layer electromagnetic wave absorber 100 includes an absorption layer 120 and a boundary layer 130 laminated on the rear side of the absorption layer 120. The absorption layer 120 includes a dielectric lossy material or a magnetic lossy material, so as to absorb an electromagnetic wave. The boundary layer 130 is made of a highly conductive electric conductor in order to block and reflect an electromagnetic wave which is not absorbed by the absorption layer 120.

FIG. 2 is a graph illustrating a reflection loss according to a frequency of the single layer electromagnetic wave absorber shown in FIG. 1.

In FIG. 2, thicknesses of the absorption layer 120 are differentiated by a two-dot chain line, an alternate long and short dash line, and a solid line, which respectively indicate thicknesses of 2.0 mm, 3.0 mm and 4.0 mm. As shown in FIG. 2, the single layer electromagnetic wave absorber 100 has an absorption performance in one vertex A of 10 GHz, which is the center frequency of the X-band frequency range of 8.2~12.4 GHz. Hence, a 10 dB absorption band width (a bandwidth absorbing 90% or more of an incident electromagnetic wave) is about 2.6~6.4 GHz, which means that the absorption bandwidth is too narrow. Accordingly, a multi-layer electromagnetic wave absorber is used so as to broaden the absorption bandwidth. This conventional multi-layer electromagnetic wave absorber is composed of a surface layer, an absorption layer and a boundary layer. The surface layer and the absorption layer include only one of a dielectric lossy material and magnetic lossy material. Accordingly, although the absorption bandwidth of the conventional multi-layer electromagnetic wave absorber becomes wider than the single layer electromagnetic wave absorber, a thickness of the multi-layer electromagnetic wave absorber becomes too large.

SUMMARY OF THE INVENTION

An aspect of the present invention is to address at least the above-mentioned problems and/or disadvantages and to provide at least the advantages described below. Accordingly, an aspect of the present invention is to provide a multi-layer electromagnetic wave absorber for implementing an absorb performance of broadband with a thin design and a manufacturing method thereof.

In accordance with an aspect of the present invention, a multi-layer electromagnetic wave absorber is provided. The absorber includes a surface layer comprising at least one of a dielectric lossy mixture and a magnetic lossy mixture, an absorption layer, laminated on a rear side of the surface layer, comprising a dielectric lossy mixture having a higher loss than the dielectric lossy mixture for the surface layer and a magnetic lossy mixture having a higher loss than the magnetic lossy mixture for the surface layer, and a boundary layer, laminated on a rear side of the absorption layer, comprising a conductive material.

In accordance with another aspect of the present invention, a method of manufacturing a multi-layer electromagnetic wave absorber is provided. The method includes forming a surface layer comprising at least one of a dielectric lossy mixture and a magnetic lossy mixture, forming an absorption layer comprising a dielectric lossy mixture for the absorption layer having a higher loss than the dielectric lossy mixture for the surface layer and a magnetic lossy mixture for the absorption layer having a higher loss than the magnetic lossy mixture for the surface layer, laminating the absorption layer onto a rear side of the surface layer, and laminating a boundary layer, comprising a conductive material, on a rear side of the absorption layer.

According to aspects of the present invention, since the absorption layer includes a dielectric lossy mixture having a higher loss than the dielectric lossy mixture for the surface layer and also includes a magnetic lossy mixture for the absorption layer having a higher loss than the magnetic lossy mixture for the surface layer, aspects of the present invention provide a thin multi-layer electromagnetic wave absorber which is able to perform wideband absorption.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, a multi-layer electromagnetic wave absorber and a method of manufacturing a multi-layer electromagnetic wave absorber according to the present invention are illustrated with reference to the attached drawings.

Figure 1:
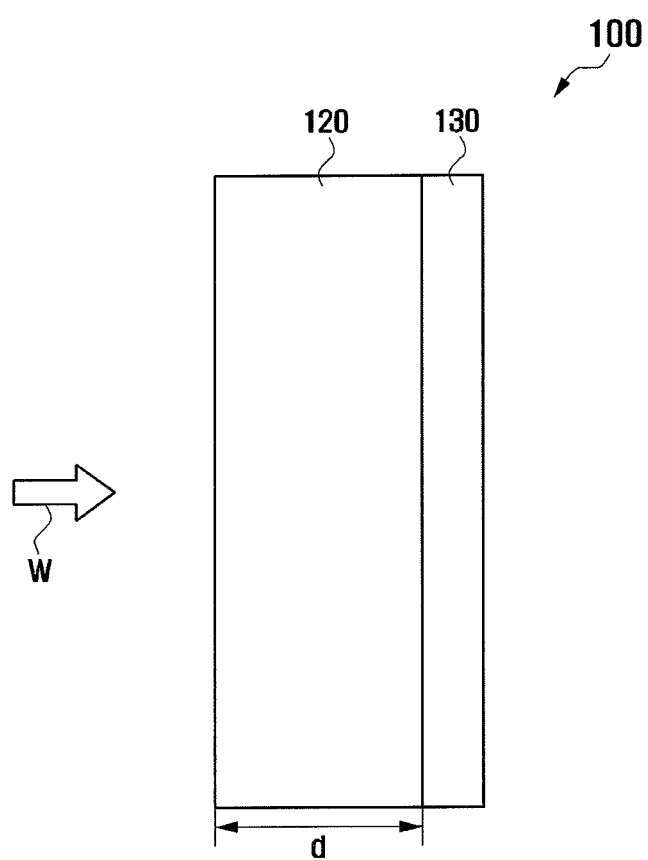
FIG. 1 is a cross-sectional view of a single layer electromagnetic wave absorber according to the related art.
Figure 2:
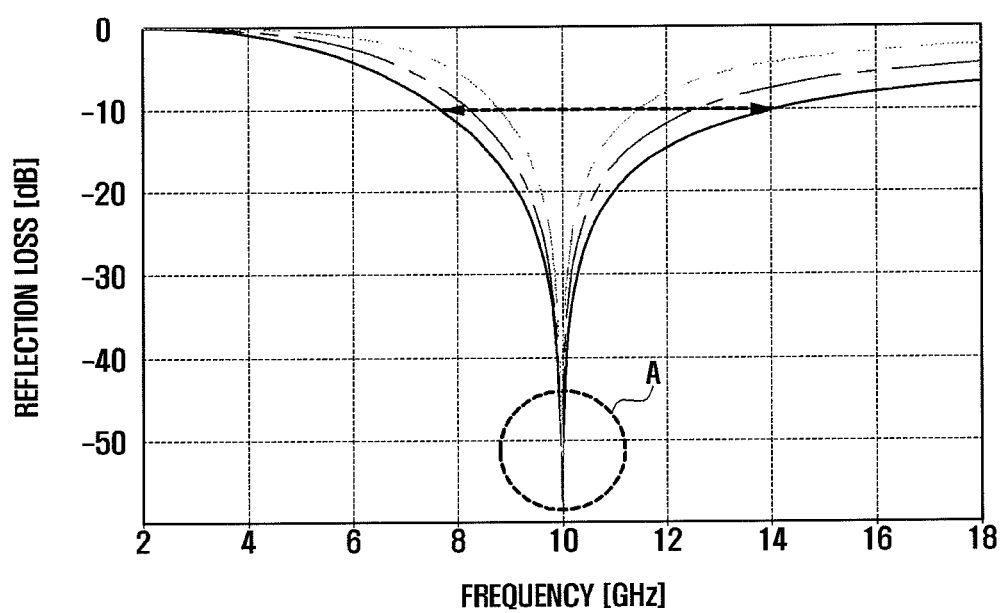
FIG. 2 is a reflection loss according to a frequency of a single layer electromagnetic wave absorber shown in FIG. 1.
Figure 3:
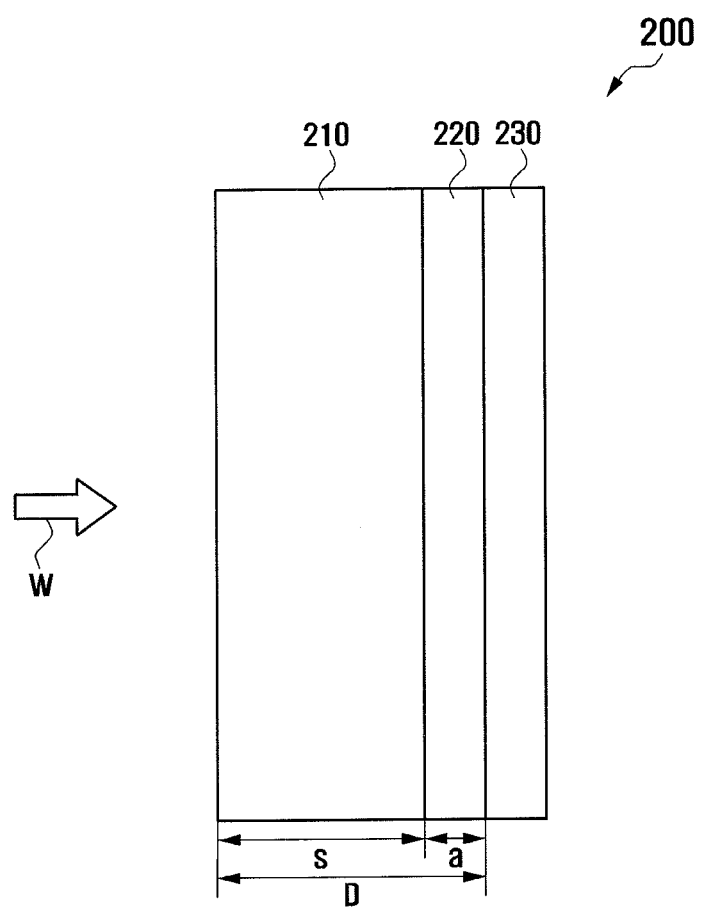
FIG. 3 is a cross-sectional view of a multi-layer electromagnetic wave absorber according to an exemplary embodiment of the present invention.
Figure 4:
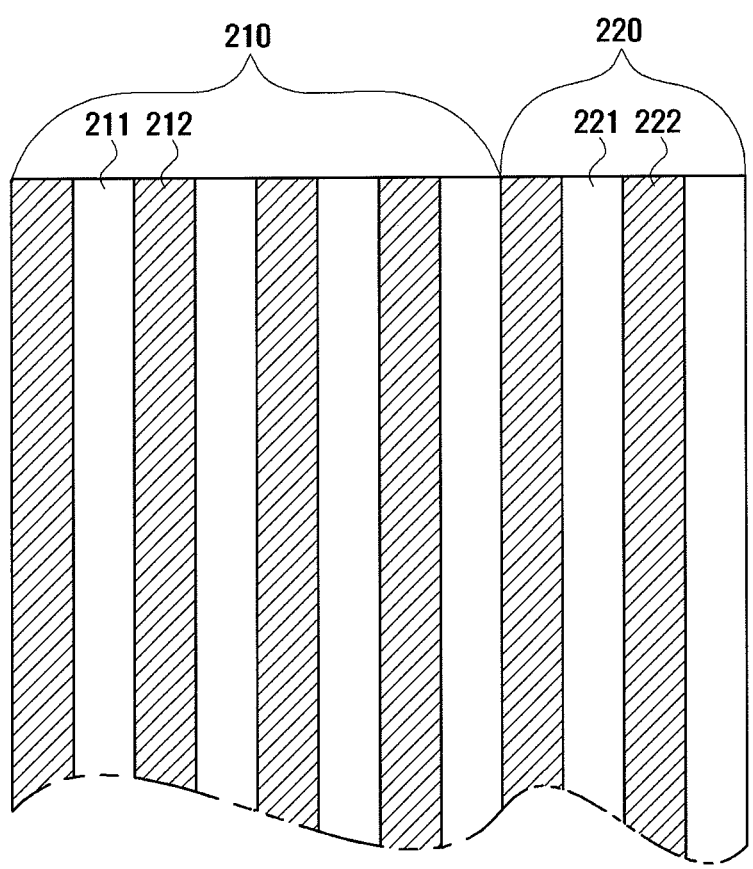
FIG. 4 is a partial cross-sectional view illustrating a surface layer and an absorption layer of the multi-layer electromagnetic wave absorber shown in FIG. 3.

FIG. 3 is a cross-sectional view of a multi-layer electromagnetic wave absorber according to an exemplary embodiment of the present invention, and FIG. 4 is a partial cross-sectional view illustrating a surface layer and an absorption layer of the multi-layer electromagnetic wave absorber shown in FIG. 3.

Referring to FIGS. 3 to 4, a multi-layer electromagnetic wave absorber, according to an exemplary embodiment of the present invention, is illustrated. A multi-layer electromagnetic wave absorber 200 includes a surface layer 210, an absorption layer 220 and a boundary layer 230. The surface layer 210 includes a lossy material for the surface layer 210 in order to reduce a wavelength of an incident electromagnetic wave W. It is preferable that a low lossy material is used so as to reduce a direct surface reflection of the incident electromagnetic wave W.

In an exemplary embodiment, the lossy material for the surface layer 210 is composed of a dielectric lossy mixture and a magnetic lossy mixture. However, the lossy material can be composed of at least one of the dielectric lossy mixture and the magnetic lossy mixture. The dielectric lossy mixture for the surface layer 210 is made by mixing a dielectric lossy material, an epoxy, a hardener and a solvent together. The dielectric lossy material is formed of a carbon nano-particle, such as a carbon nano tube, and a carbon nano fiber. However, aspects of the present invention are not limited thereto, and the dielectric lossy material may be other suitable materials. The magnetic lossy mixture for the surface layer 210 is made by mixing the magnetic lossy material, the epoxy, the hardener and the solvent together. The magnetic lossy material is formed of a ferromagnetic field material such as Co, NiFe of submicron size. However, aspects of the present invention are not limited thereto, and the magnetic lossy material may be formed of other suitable materials. Then, the inner structure of the surface layer 210 is illustrated with reference to FIG. 4.

Referring to FIG. 4, a dielectric lossy sheet 211 for the surface layer 210 and a magnetic lossy sheet 212 for the surface layer 210 are alternately laminated to form the surface layer 210. The dielectric lossy sheet 211 includes the dielectric lossy mixture for the surface layer 210, and the magnetic lossy sheet 212 for the surface layer includes magnetic lossy mixture for the surface layer 210. In an exemplary structure of the present embodiment, since the lossy material for the surface layer 210 is comprised of the dielectric lossy mixture for the surface layer 210 and the magnetic lossy mixture for the surface layer 210, the dielectric lossy sheet 211 for the surface layer 210 and the magnetic lossy sheet 212 for the surface layer 210 are alternately laminated. However, in case the lossy material for the surface layer 210 is comprised of one among the dielectric lossy mixture for the surface layer 210 and the magnetic lossy mixture for the surface layer 210, only the dielectric lossy sheet 211 for the surface layer 210 is laminated or only the magnetic lossy sheet 212 for the surface layer 210 is laminated.

For the surface layer 210, a dielectric loss tangent ($\tan(\in_r''/\in_r')$), wherein $\in_r$ is the relative permittivity, and a magnetic loss tangent ($\tan(\mu_r''/\mu_r')$), wherein $\mu_r$, is the relative permeability, of the surface layer 210 gradually increase toward the rear side of the surface layer 210. However, aspects of the present invention are not limited thereto, and the surface layer 210 may have other configurations with respect to the dielectric and magnetic loss tangents. The absorption layer 220 absorbs energy of the incident electromagnetic wave W, and is laminated onto a rear side of the surface layer 210, wherein the rear side of the surface layer 210 faces the boundary layer 230, as shown in FIG. 3. The absorption layer 220 includes a lossy material having dielectric and magnetic properties. Accordingly, the lossy material for the absorption layer 210 is made of the dielectric lossy mixture and the magnetic lossy mixture. In an exemplary implementation, components of the dielectric lossy mixture for the absorption layer 220 are substantially identical with components of the dielectric lossy mixture for the surface layer 210, and components of the magnetic lossy mixture for the surface layer 210 are substantially identical with components of the magnetic lossy mixture for the absorption layer 220.

In addition, the lossy material for the absorption layer 220 has a higher loss than the loss of the lossy material for the surface layer 210. Accordingly, an average dielectric loss tangent (mean value of $\tan(\in_r''/\in_r')$) of the absorption layer 220 is greater than an average dielectric loss tangent (mean value of $\tan(\epsilon_r''/\epsilon_r')$) of the surface layer 210. Also, an average magnetic loss tangent (mean value of $\tan(\mu_r''/\mu_r')$) of the absorption layer 220 is greater than an average magnetic loss tangent (mean value of $\tan(\mu_r''/\mu_r')$) of the surface layer 210. Moreover, the dielectric lossy mixture and the magnetic lossy mixture for the absorption layer 220 respectively have higher content ratios of dielectric lossy material and magnetic lossy material than the dielectric lossy mixture and the magnetic lossy mixture for the surface layer 210.

The absorption layer 220 has an inner structure wherein a dielectric lossy sheet 221 and a magnetic lossy sheet 222 are alternately laminated in a manner similar to that of an inner structure of the surface layer 210. A dielectric lossy tangent and a magnetic lossy tangent of the absorption layer 220 gradually increase toward the rear side of the absorption layer 220. However, aspects of the present invention are not limited thereto, and the dielectric and magnetic lossy tangents may vary in other manners. Since the wavelength of the incident electromagnetic wave W decreases while penetrating through the surface layer 210, a thickness a of the absorption layer 220 is smaller than a thickness s of the surface layer 210, as shown in FIG. 3. However, aspects of the present invention are not limited thereto, and thicknesses of the surface layer 210 and the absorption layer 220 may be other suitable thicknesses. The boundary layer 230 includes a conductive material so as to shield and reflect the electromagnetic wave which is not absorbed in the absorption layer 220. The boundary layer 230 is laminated on a rear side of the absorption layer 220, wherein the rear side of the absorption layer 220 faces away from the surface layer, as shown in FIG. 3. A carbon/epoxy plain weave type prepreg composite can be laminated onto the absorption layer 220, or a silver paste can be coated onto the rear side of the absorption layer 220 to form the boundary layer 230. For the boundary layer 230, a conductivity of a metal, such as the silver paste, is $10^6 \sim 10^7$ S/m, and a conductivity of the carbon/epoxy plain weave type prepreg composite is $10^4 \sim 10^6$ S/m. However, aspects of the present invention are not limited thereto, and metals and prepreg composites having other suitable conductivities may be used.

Figure 5:
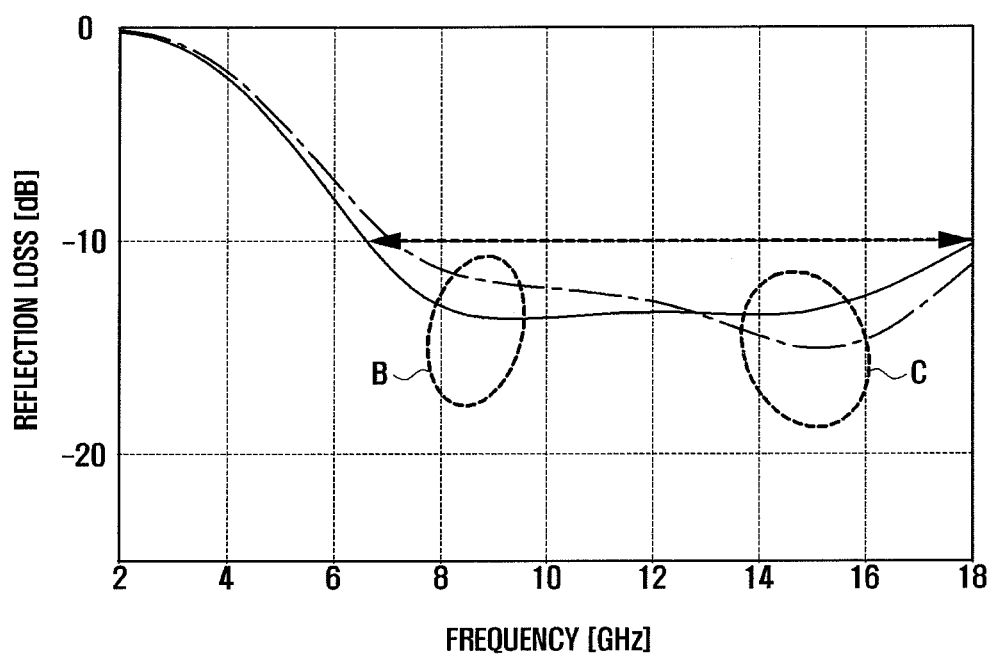
FIG. 5 is a graph illustrating a reflection loss according to a frequency of multi-layer electromagnetic wave absorber according to an exemplary embodiment of the present invention.

FIG. 5 is a graph illustrating a reflection loss according to a frequency of multi layer electromagnetic wave absorber according to an exemplary embodiment of the present invention.

In FIG. 5, a first example is illustrated using an alternating long and short dash line, and a second example is illustrated using a solid line. The thickness, the complex permittivity, and the complex permeability of the surface layer and the absorption layer of the first and second examples are written in Table 1.

TABLE 1

| Item | First Example | | Second Example | |
|---|---|---|---|---|
| | Surface layer | Absorb layer | Surface layer | Absorb layer |
| Thickness(mm) | 2.1 | 1.2 | 2.1 | 1.2 |
| complex permittivity ($\epsilon_r'/\epsilon_r''$) | (6, 0.2) | (28, 26) | (6, 0.2) | (28, 26) |
| complex permeability ($\mu_r'/\mu_r''$) | (1, 0) | (1.2, 0.24) | (1.05, 0.1) | (1.2, 0.24) |

A conventional multi-layer electromagnetic wave absorber has a 10 dB absorption band width of 3~10 GHz with a thickness of about 5~20 mm around the X-band.

On the other hand, as shown in Table 1 and FIGS. 3 to 5, the first example and the second example of the present invention have a 10 dB absorption bandwidth of over 11 GHz while having two vertexes B and C in the X-band (8.2~12.4 GHz) and the Ku-band (12~18 GHz) with the thickness D of 3.3 mm (see FIG. 3). That is, the multi-layer electromagnetic wave absorber of the present exemplary embodiment has an absorption performance of a wider bandwidth than the conventional multi-layer electromagnetic wave absorber while also being thinner than the conventional multi-layer electromagnetic wave absorber.

FIGS. 6A to 6H illustrate a method of manufacturing a multi-layer electromagnetic wave absorber according to an exemplary embodiment of the present invention.

Referring to FIGS. 6A to 6H, the multi-layer electromagnetic wave absorber manufacturing method is illustrated. The multi-layer electromagnetic wave absorber manufactured by the present embodiment is used as a Radar Absorbing Material (RAM). However, aspects of the present invention are not limited thereto, and the multi-layer electromagnetic wave absorber may be used for other suitable purposes. A dielectric lossy material, an epoxy, a hardener and a solvent are mixed to make a dielectric lossy mixture for a surface layer 310 and a dielectric lossy mixture for an absorption layer 320. The dielectric lossy material is formed of a carbon nano-particle, such as a carbon nano tube, and a carbon nano fiber. However, aspects of the present invention are not limited thereto, and other suitable materials may be used as the dielectric lossy material.

Additionally, a magnetic lossy material, an epoxy, a hardener and a solvent are mixed together to make a magnetic lossy mixture for the surface layer 310 and for the absorption layer 320. The magnetic lossy material is formed of a ferromagnetic field material such as Co and NiFe of sub micron size. However, aspects of the present invention are not limited thereto and the magnetic lossy material may be formed of other suitable materials. Moreover, the dielectric lossy mixture and the magnetic lossy mixture for the absorption layer 310 have a higher content ratio of the dielectric lossy material and the magnetic lossy material than the dielectric lossy mixture and the magnetic lossy mixture for the surface layer 310.

Figure 6A:
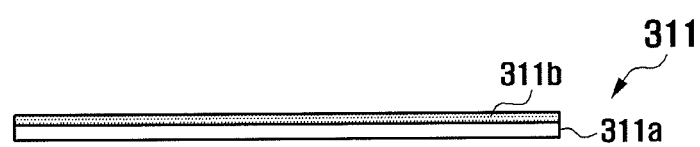
FIGS. 6A to 6H illustrate a multi-layer electromagnetic wave absorber manufacturing method according to an exemplary embodiment of the present invention.
Figure 6B:
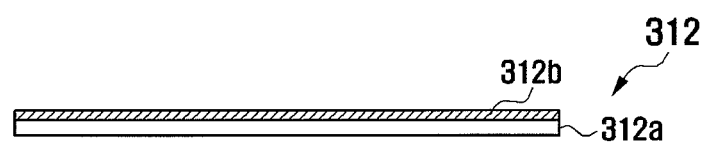
Figure 6C:
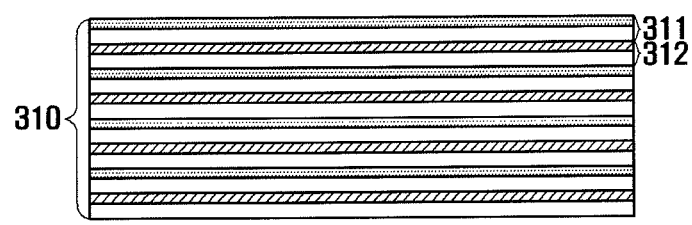
Figure 6D:
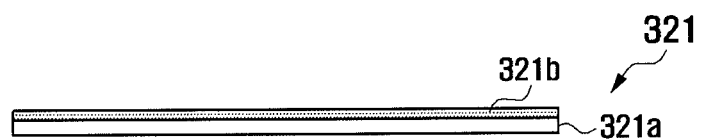
Figure 6E:
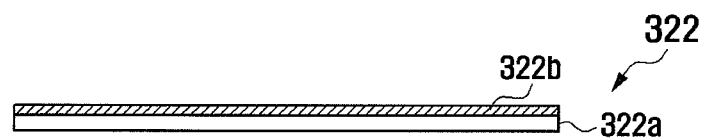
Figure 6F:
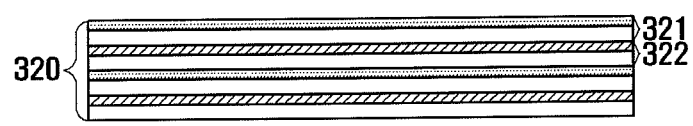
Figure 6G:
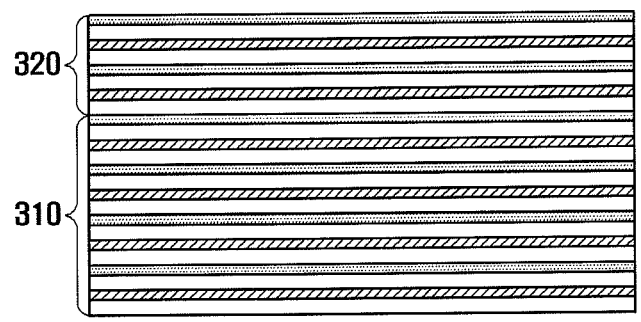
Figure 6H:
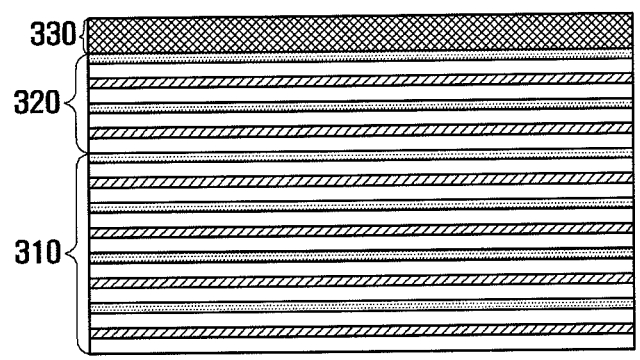

Firstly, as shown in FIG. 6A, a dielectric lossy mixture 311b for the surface layer 310 is coated on a film 311a to form a dielectric lossy sheet 311. Next, as shown in FIG. 6B, a magnetic lossy mixture 312b for the surface layer 310 is coated on a film 312a to form a magnetic lossy sheet 312. Then, as shown in FIG. 6C, the dielectric lossy sheet 311 and the magnetic lossy sheet 312 are alternately laminated to form the surface layer 310. Next, as shown in FIG. 6D, a dielectric lossy mixture 321b for the absorption layer 320 is coated on a film 321a to form a dielectric lossy sheet 321. As shown in FIG. 6E, a magnetic lossy mixture 322b for the absorption layer 320 is coated on a film 322a to form a magnetic lossy sheet 322. Next, as shown in FIG. 6F, the dielectric lossy sheet 321 and the magnetic lossy sheet 322 are alternately laminated to form the absorption layer 320. Then, as shown in FIG. 6G, the absorption layer 320 is laminated onto a rear side of the surface layer 310. Then, as shown in FIG. 6H, a silver paste is coated onto a rear side of the absorption layer 320 to form a boundary layer 330. In the related art, since the material properties of the magnetic lossy material and the dielectric lossy material are different, the magnetic lossy material and the dielectric lossy material are difficult to mix into one film to be coated. However, in the present embodiment, since a magnetic lossy sheet and a dielectric lossy sheet are alternately laminated so as to overcome such a problem, the absorption layer 320 having both dielectric properties and magnetic properties can be easily manufactured.

FIGS. 7A to 7H illustrate a method of manufacturing a multi-layer electromagnetic wave absorber according to an exemplary embodiment of the present invention.

Referring to FIGS. 7A to 7H, the present exemplary embodiment of the multi-layer electromagnetic wave absorber manufacturing method is illustrated. The multi-layer electromagnetic wave absorber manufactured by this exemplary embodiment is used as a Radar Absorbing Structure (RAS), however, aspects of the present invention are not limited thereto, and the multi-layer electromagnetic wave absorber may be used for other suitable purposes. In the present exemplary embodiment, the dielectric lossy mixtures for a surface layer 410 and for an absorption layer 420, and the magnetic lossy mixtures for the surface layer 410 and for the absorption layer 420 are manufactured by substantially the same method as the exemplary embodiment of FIGS. 6A to 6H.

The dielectric lossy mixture and the magnetic lossy mixture for the absorption layer 420 have a higher content ratio of the dielectric lossy material and the magnetic lossy material than the dielectric lossy mixture and the magnetic lossy mixture for the surface layer 410.

Figure 7A:
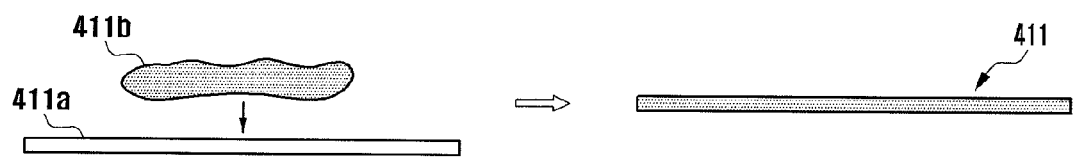
FIGS. 7A to 7H illustrate a multi-layer electromagnetic wave absorber manufacturing method according to an exemplary embodiment of the present invention.
Figure 7B:
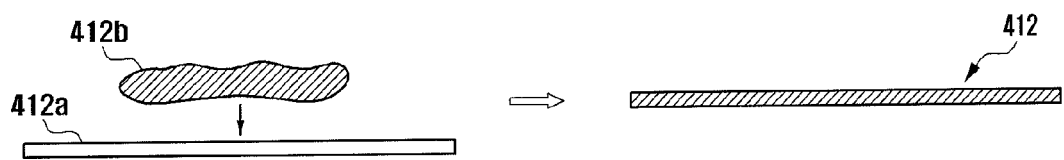
Figure 7C:
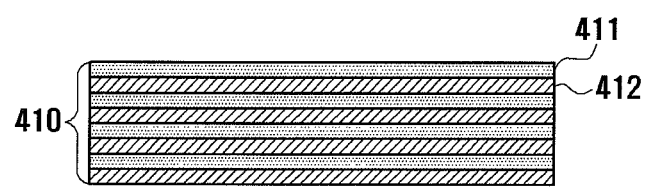
Figure 7D:
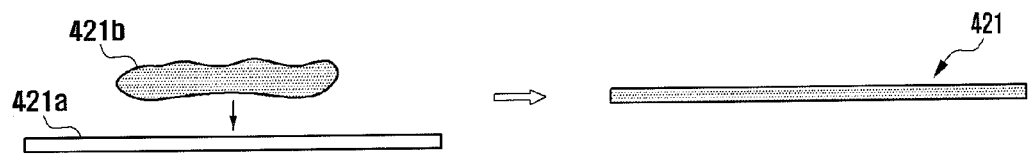
Figure 7E:
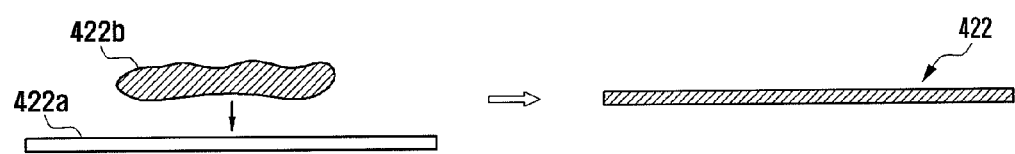
Figure 7F:
Figure 7G:
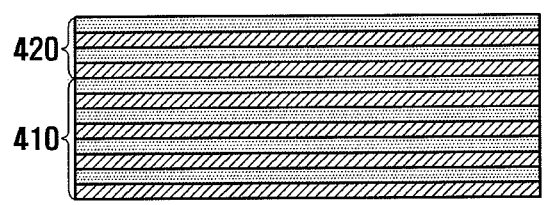
Figure 7H:
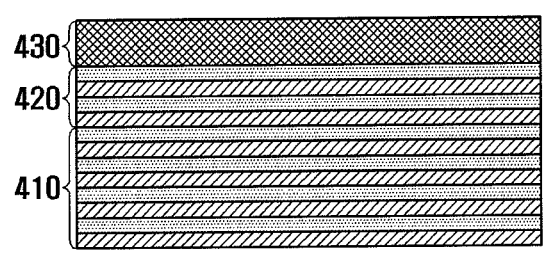

Firstly, as shown in FIG. 7A, a dielectric lossy mixture 411b for the surface layer 410 is impregnated into a glass/epoxy plain weave type prepreg composite 411a to form a dielectric lossy sheet 411. Next, as shown in FIG. 7B, a magnetic lossy mixture 412b for the surface layer 310 is impregnated into a glass/epoxy plain weave type prepreg composite 412a to form a magnetic lossy sheet 412. Then, as shown in FIG. 7C, the dielectric lossy sheet 411 and the magnetic lossy sheet 412 are alternately laminated to form the surface layer 410. Next, as shown in FIG. 7D, a dielectric lossy mixture 421b for the absorption layer 420 is impregnated into a glass/epoxy plain weave type prepreg composite 421a to form a dielectric lossy sheet 421. As shown in FIG. 7E, a magnetic lossy mixture 422b for the absorption layer 420 is infiltrated into a glass/epoxy plain weave type prepreg composite 422a to form a magnetic lossy sheet 422. Next, as shown FIG. 7F, the dielectric lossy sheet 421 and the magnetic lossy sheet 422 are alternately laminated to form the absorption layer 420. Next, as shown in FIG. 7G, the absorption layer 420 is laminated onto a rear side of the surface layer 410. Then, as shown in FIG. 7H, a carbon/epoxy plain weave type prepreg composite is laminated onto a rear side of the absorption layer 420 to form a boundary layer 430.

While the invention has been shown and described with reference to certain exemplary embodiments thereof, it will be understood by those skilled in the art that various changes in form and details may be made therein without departing from the spirit and scope of the invention as defined in the appended claims and their equivalents.

What is claimed is:

1. A multi-layer electromagnetic wave absorber comprising:
    a surface layer comprising at least one of a dielectric lossy mixture and a magnetic lossy mixture;
    an absorption layer, laminated on a rear side of the surface layer, comprising:
        a dielectric lossy mixture having a higher loss than the dielectric lossy mixture for the surface layer; and
        a magnetic lossy mixture having a higher loss than the magnetic lossy mixture for the surface layer; and
    a boundary layer, laminated on a rear side of the absorption layer, comprising a conductive material.

2. The multi-layer electromagnetic wave absorber of claim 1, wherein the absorption layer comprises:
    a dielectric lossy sheet comprising the dielectric lossy mixture for the absorption layer; and
    a magnetic lossy sheet comprising the magnetic lossy mixture for the absorption layer.

3. The multi-layer electromagnetic wave absorber of claim 2, wherein the dielectric lossy sheet and the magnetic lossy sheet are alternately laminated to each other in the absorption layer.

4. The multi-layer electromagnetic wave absorber of claim 1, wherein the surface layer comprises:
    a dielectric lossy sheet comprising the dielectric lossy mixture for the surface layer; and
    a magnetic lossy sheet comprising the magnetic lossy mixture for the surface layer.

5. The multi-layer electromagnetic wave absorber of claim 4, wherein the dielectric lossy sheet and the magnetic lossy sheet are alternately laminated to each other in the surface layer.

6. The multi-layer electromagnetic wave absorber of claim 1, wherein an average dielectric loss tangent of the absorption layer is greater than an average dielectric loss tangent of the surface layer.

7. The multi-layer electromagnetic wave absorber of claim 1, wherein an average magnetic loss tangent of the absorption layer is greater than an average magnetic loss tangent of the surface layer.

8. The multi-layer electromagnetic wave absorber of claim 1, wherein a content ratio of dielectric lossy material of the dielectric lossy mixture for the absorption layer is higher than a content ratio of dielectric lossy material of the dielectric lossy mixture for the surface layer.

9. The multi-layer electromagnetic wave absorber of claim 1, wherein a content ratio of magnetic lossy material of the magnetic lossy mixture for the absorption layer is higher than a content ratio of magnetic lossy material of the magnetic lossy mixture for the surface layer.

10. The multi-layer electromagnetic wave absorber of claim 8, wherein the dielectric lossy material comprises a carbon nano particle.

11. The multi-layer electromagnetic wave absorber of claim 9, wherein the magnetic lossy material comprises a ferromagnetic field material.

* * * * *